US012742927B2

(12) United States Patent
Suthram et al.

(10) Patent No.: US 12,742,927 B2
(45) Date of Patent: Sep. 22, 2026

(54) HYBRID BONDING WITH PHOTONIC INTEGRATED CIRCUITS FOR HIGH BANDWIDTH RETICLE STITCHING OF RETICLE SIZED INTEGRATED CIRCUIT DIES

(71) Applicant: Intel Corporation, Santa Clara, CA (US)

(72) Inventors: Sagar Suthram, Portland, OR (US); Debendra Mallik, Chandler, AZ (US); John Heck, Berkeley, CA (US); Pushkar Sharad Ranade, San Jose, CA (US); Ravindranath Vithal Mahajan, Chandler, AZ (US); Thomas Liljeberg, San Jose, CA (US); Wilfred Gomes, Portland, OR (US); Abhishek A. Sharma, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 205 days.

(21) Appl. No.: 17/853,732

(22) Filed: Jun. 29, 2022

(65) Prior Publication Data

US 2024/0004129 A1 Jan. 4, 2024

(51) Int. Cl.

| | |
|---|---|
| ***G02B 6/43*** | (2006.01) |
| ***G02B 6/12*** | (2006.01) |
| ***G02B 6/13*** | (2006.01) |
| ***H10W 90/00*** | (2026.01) |
| *H10W 80/00* | (2026.01) |

(52) U.S. Cl.

CPC ..... *G02B 6/12002* (2013.01); *G02B 6/12004* (2013.01); *G02B 6/13* (2013.01); *G02B 6/43* (2013.01); *H10W 90/00* (2026.01); *H10W 80/312* (2026.01); *H10W 80/327* (2026.01); *H10W 90/792* (2026.01)

(58) Field of Classification Search

CPC ........................................................ G02B 6/43

See application file for complete search history.

(56) References Cited

U.S. PATENT DOCUMENTS

| | | | | |
|---|---|---|---|---|
| 7,292,050 | B1 * | 11/2007 | Chow | H01L 23/642 702/179 |
| 11,493,714 | B1 * | 11/2022 | Mendoza | H01L 24/47 |
| 12,191,257 | B2 * | 1/2025 | Aggarwal | G02B 6/136 |

(Continued)

*Primary Examiner* — Charlie Y Peng

(74) *Attorney, Agent, or Firm* — Akona IP PC

(57) ABSTRACT

Embodiments of a microelectronic assembly comprise: a plurality of microelectronic sub-assemblies arranged in an array; and a plurality of photonic integrated circuit (PIC) dies, each PIC die having waveguides. Adjacent microelectronic sub-assemblies are coupled to one of the PIC dies by interconnects such that any one PIC die is coupled to more than two adjacent microelectronic sub-assemblies, and the microelectronic sub-assemblies coupled to each PIC die in the plurality of PIC dies are communicatively coupled by the waveguides in the PIC die. Each microelectronic sub-assembly comprises: an interposer integrated circuit (IC) die comprising one or more electrical controller circuit proximate to at least one edge of the interposer IC die; a first plurality of IC dies coupled to a first surface of the interposer IC die; and a second plurality of IC dies coupled to an opposing second surface of the interposer IC die.

20 Claims, 8 Drawing Sheets

(56) References Cited

U.S. PATENT DOCUMENTS

| | | | | |
|---|---|---|---|---|
| 12,436,346 | B2 * | 10/2025 | Winterbottom | G02F 1/0157 |
| 2010/0266295 | A1 | 10/2010 | Zheng et al. | |
| 2016/0109655 | A1 * | 4/2016 | Vurgaftman | G02B 6/12004<br>385/14 |
| 2021/0271020 | A1 | 9/2021 | Islam et al. | |
| 2022/0291465 | A1 * | 9/2022 | Bernabe | G02B 6/4212 |
| 2023/0420432 | A1 * | 12/2023 | Suthram | H01L 23/3107 |

* cited by examiner 100
126
126
108
110(1)
122(1)
104
122(2)
110(2)
102(1)
102(1)
142
140

B'
300
102
300
104
300
102
300
104
300
102
300
304
104
C
C'
312
102
306
122
300
308
B
300
100
310

300
102
304
106
122
314
312
300
102
318
308
320
100
122
316

HYBRID BONDING WITH PHOTONIC INTEGRATED CIRCUITS FOR HIGH BANDWIDTH RETICLE STITCHING OF RETICLE SIZED INTEGRATED CIRCUIT DIES

TECHNICAL FIELD

The present disclosure relates to techniques, methods, and apparatus directed to hybrid bonding with photonic integrated circuits for high bandwidth reticle stitching of reticle sized integrated circuit dies.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
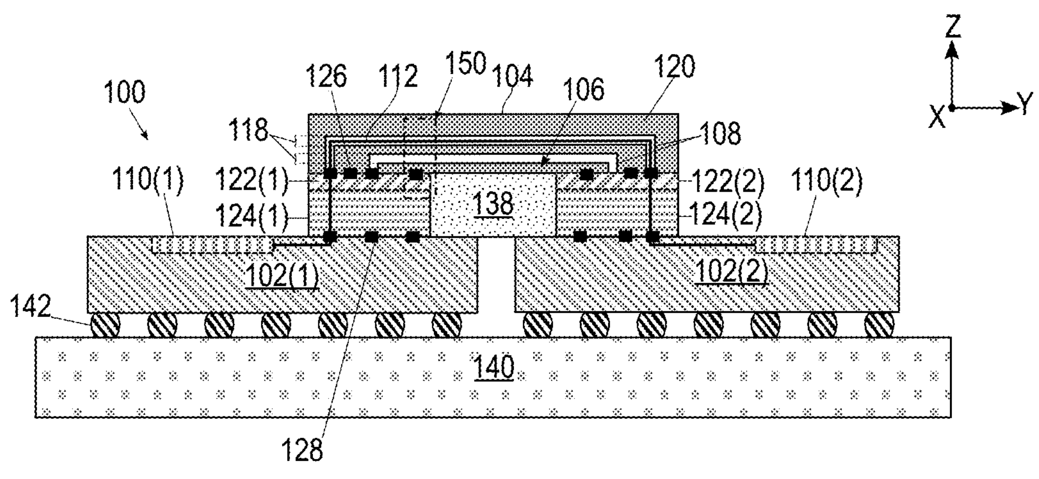
FIG. 1A is a schematic cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

As Moore's law nears its natural limits, supercomputing faces inherent physical problems in moving toward zettascale systems. Zettascale computing aims to create 1000× the current level of compute today in or around the latter half of the decade, to take advantage of high demand for computational resources by both consumers and businesses, and to implement data hungry applications, such as artificial intelligence, machine learning and such. Zettascale supercomputers are targeted to have computing performance in the order of one zettaflops. One zettaflops equals one thousand exaflops, or one sextillion floating point operations per second. Despite advances in semiconductor processing and logic design that have permitted an increase in the amount of logic circuits that may be included in processors and other IC devices, signal speeds reach physics-based bottlenecks to achieve zettascale performance, for example, from the inherent limitations of the materials used for signal propagation, such as copper in a dielectric medium, heat transfer challenges from high intensity computations, and power delivery constraints to power several thousand simultaneous computations in multiple processors.

Many processors used in current supercomputers and other processing devices already have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer. Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional. Consequently, the trend in the processor industry is to move toward disaggregation, using multiple known good chiplets (smaller sized IC dies) made using different manufacturing technologies and assembling them together into one microprocessor using novel bonding techniques.

Accordingly, embodiments of a microelectronic assembly disclosed herein comprise: a first IC die; a second IC die; and a photonic IC (PIC) die conductively coupled to the first IC die and the second IC die. The first IC die and the second IC die are coplanar, adjacent, and separated by a gap, the PIC die comprises optical structures, the optical structures include at least one waveguide, and electrical circuits in the first IC die are communicatively coupled to electrical circuits in the second IC die by at least one photonic pathway through the waveguide. The optical structures further include a plurality of waveguides in more than one layer of a dielectric material in the PIC die. The PIC die is conductively coupled to electrical controller circuits configured to control operations of at least some optical structures in the PIC die. By enabling disaggregation using multiple IC dies, and photonic pathways between IC dies for communication, bottlenecks in signal speeds due to the inherent limitations of electrical conduction can be vastly reduced while also achieving better manufacturing yield, advancing closer to practical zettascale performance.

Embodiments of a microelectronic assembly further comprise: a plurality of microelectronic sub-assemblies arranged in an array; and a plurality of PIC dies, each PIC die having waveguides. Adjacent microelectronic sub-assemblies are coupled to one of the PIC dies by interconnects such that any one PIC die is coupled to more than two adjacent microelectronic sub-assemblies, and the microelectronic sub-assemblies coupled to each PIC die in the plurality of PIC dies are communicatively coupled by the waveguides in the PIC die. Each microelectronic sub-assembly comprises: an interposer IC die comprising one or more electrical controller circuit proximate to at least one edge of the interposer IC die; a first plurality of IC dies coupled to a first surface of the interposer IC die; and a second plurality of IC dies coupled to an opposing second surface of the interposer IC die.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term “optical structure” includes arrangements of forms fabricated in ICs to receive, transform and/or transmit optical signals as described herein. It may include optical conductors such as waveguides, electromagnetic radiation sources such as lasers and light-emitting diodes (LEDs) and electro-optical devices such as photodetectors.

In various embodiments, any photonic IC (PIC) described herein may comprise a semiconductor material including, for example, N-type or P-type materials. The PIC may include, for example, a crystalline base material formed using a bulk silicon (or other bulk semiconductor material) or a SOI structure (or, in general, a semiconductor-on-insulator structure). In some embodiments, the PIC may be formed using alternative materials, which may or may not be combined with silicon, that include, but are not limited to, lithium niobite, indium phosphide, silicon dioxide, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the PIC may comprise a non-crystalline material, such as polymers. In some embodiments, the PIC may be formed on a printed circuit board (PCB). In some embodiments, the PIC may be inhomogeneous, including a carrier material (such as glass or silicon carbide) as a base material with a thin semiconductor layer over which is an active side comprising transistors and like components. Although a few examples of the material for the PIC are described here, any material or structure that may serve as a foundation upon which the PIC may be built falls within the spirit and scope of the present disclosure.

The term “insulating” means “electrically insulating,” the term “conducting” means “electrically conducting,” unless otherwise specified. With reference to optical signals and/or devices, components and elements that operate on or using optical signals, the term “conducting” can also mean “optically conducting.”

The terms “oxide,” “carbide,” “nitride,” etc. refer to compounds containing, respectively, oxygen, carbon, nitrogen, etc.

The term “high-k dielectric” refers to a material having a higher dielectric constant than silicon oxide, while the term “low-k dielectric” refers to a material having a lower dielectric constant than silicon oxide.

The term “insulating material” or “insulator” (also called herein as “dielectric material” or “dielectric”) refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a “work function” material, provided over a portion of the channel material (the “channel portion”) between the source and the drain regions, and optionally, also includes a gate dielectric material between the gate electrode material and the channel material.

In a general sense, an “interconnect” refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term “interconnect.” The nature of the interconnect being described is to be understood herein with reference to the signal medium associated therewith. Thus, when used with reference to an electronic device, such as an IC that operates using electrical signals, the term “interconnect” describes any element formed of an electrically conductive material for providing electrical connectivity to one or more elements associated with the IC or/and between various such elements. In such cases, the term “interconnect” may refer to both conductive traces (also sometimes referred to as “lines,” “wires,” “metal lines” or “trenches”) and conductive vias (also sometimes referred to as “vias” or “metal vias”). Sometimes, electrically conductive traces and vias may be referred to as “conductive traces” and “conductive vias”, respectively, to highlight the fact that these elements include electrically conductive materials such as metals. Likewise, when used with reference to a device that operates on optical signals as well, such as a photonic IC (PIC), “interconnect” may also describe any element formed of a material that is optically conductive for providing optical connectivity to one or more elements associated with the PCI. In such cases, the term “interconnect” may refer to optical waveguides, including optical fiber, optical splitters, optical combiners, optical couplers, and optical vias.

The term “waveguide” refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 micrometers and 300 micrometers, while the DTD interconnects disclosed herein may have a pitch between about 0.5 micrometers and 100 micrometers, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond-pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112*a*-112*e*), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a schematic cross-sectional view of an example microelectronic assembly 100 according to some embodiments of the present disclosure. Microelectronic assembly 100, comprises, in the embodiment shown, IC dies 102, for example, IC dies 102(1) and 102(2), conductively coupled (with intervening components) to a PIC die 104. IC dies 102 (e.g., 102(1) and 102(2)) are coplanar, adjacent, and separated by a gap. PIC die 104 comprises optical structures 106, which include one or more waveguide 108. Electrical circuits 110, for example, electrical circuit 110(1) in IC die 102(1) and electrical circuit 110(2) in IC die 102(2) are communicatively coupled by at least one photonic pathway 112 through waveguide 108 in PIC die 104.

Figure 1B:
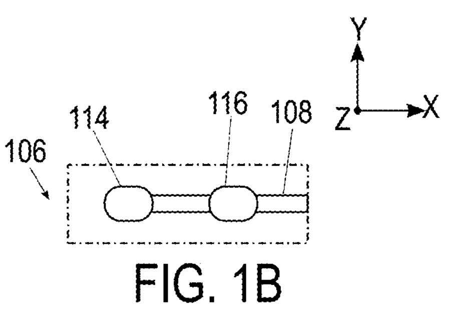
FIG. 1B is a schematic bottom view of certain details of example microelectronic assembly of FIG. 1A.

FIG. 1B is a simplified bottom view of example optical structures 106 disposed in PIC die 104. In some embodiments, optical structures 106 may be disposed in an active region of a substrate material comprising materials as described in the previous subsection. In some other embodiments, optical structures 106 may be disposed further in an interconnect stack. Example optical structures 106 include an electromagnetic radiation source 114, an electro-optical device 116, and waveguide 108. In many embodiments, optical structures 106 may be fabricated using any known method in the art, including semiconductor photolithographic and deposition methods.

Electromagnetic radiation source 114 can enable generating optical signals and may include lasers, for example if PIC die 104 supports wavelengths between about 0.8 and 1.7 micrometers; or oscillators, for example, if PIC die 104 supports wavelengths on a millimeter scale; or some combination of lasers and oscillators, for example, if PIC die 104 supports wavelengths between 0.8 micrometer and millimeter or centimeter. Electro-optical device 116 can enable receiving, transforming, and transmitting optical signals. In some embodiments, electro-optical device 116 may be any device or component configured to encode information in/on to the electromagnetic signals, such as modulator, polarizer, phase shifter, and photodetector.

Waveguide 108 can guide optical signals and also perform coupling, switching, splitting, multiplexing and demultiplexing optical signals. In some embodiments, waveguide 108 may include any component configured to feed, or launch, the electromagnetic signal into the medium of propagation such as an optical fiber. In some embodiments, waveguide 108 may further be configured as optical multiplexers and/or demultiplexers, for example, to perform a frequency division multiplexing (FDM) or wavelength division multiplexing (WDM). In some embodiments, waveguide 108 may include a de-multiplexer, such as Arrayed Waveguide Grating (AWG) de-multiplexer, an Echelle grating, a single-mode waveguide, or a thin film filter (TFF) de-multiplexer.

Waveguide 108 may comprise planar and/or non-planar waveguides of any type. In one example, waveguide 108 may comprise a silicon photonic waveguide based on silicon-on-isolator (SOI) platform, configured to guide electromagnetic radiation of any wavelength bands from about 0.8 micrometer to about 5 centimeters. In another example, waveguide 108 may support wavelengths from about 1.2 micrometers to about 1.7 micrometers in the near-infrared and infrared bands for use in data communications and telecommunications. In another example, waveguide 108 may support wavelengths from about 1 millimeter to about 10 millimeter extremely high frequency (EHF) band of radio/micro-waves), and in particular, wavelengths of about 2 millimeters may be used for radar and radio frequency (RF) wireless communications.

In some embodiments, waveguide 108 may be fabricated using direct laser writing (DLW) processes known in the art. In example embodiments, waveguide 108 may have a thickness of around 5 microns to 50 microns. In some embodiments, waveguide 108 may be planar. In other embodiments, waveguide 108 may be non-planar (e.g., curved, bent, etc.) out of the plane of the contacting surfaces of PIC die 104 and IC dies 124, and/or may be disposed in a plurality of layers 118 (labeled in FIG. 1A) of dielectric material 120. For example, one end of waveguide 108 is proximate to IC die 124(1) and another end is proximate to IC die 124(2), and a region between the ends is in layer 118 in dielectric material 120 (labeled in FIG. 1A) spaced apart from the ends. In various embodiments, waveguide 108 may be of any suitable three-dimensional shape according to various manufacturing methods and geometric constraints of PIC die 104. In various embodiments, waveguide 108 may present as grooves, lines, local deformations in glass, or other structural forms, differentiated from the dielectric material 120 by its different refractive index. The specific contours of waveguide 108 may vary with the particular process used for fabrication, for example, laser pulse properties, such as power, wavelength, pulse time, and speed of writing in a DLW process.

Although only three such example optical structures 106 are illustrated, it may be understood that PIC die 104 may include more optical structures 106 of the same or different types that enable it to function appropriately as a photonic device receiving, transforming, and transmitting optical and electrical signals.

In some embodiments, for example, in which the active surface of PIC die 104 is distant (e.g., turned away) from IC die 102, optical structures 106 may be covered with a protective layer of suitable material, such as optical epoxy on a side of PIC die 104 opposite to IC die 102. The protective layer may enable maintaining integrity of optical structures 106 during fabrication processes to which PIC die 104 may be subjected, for example, handling, attaching, solder reflowing, grinding, polishing, underfilling, and molding. The protective layer may ensure, for example, that optical transmission properties of optical structures 106 are not degraded during the fabrication processes by contamination with mold or underfill material, or that optical functionality is not compromised by tearing, breaking, or other destructive events during the fabrication processes. The protective layer may also serve to avoid leaking optical signals from optical structures 106, including waveguide 108, during operation of PIC die 104.

In general, the light provided to PIC die 104 (e.g., generated by electromagnetic radiation source 114) may include any electromagnetic signals having information encoded therein (or, phrased differently, any electromagnetic signals modulated to include information). Often, the electromagnetic signals are signals associated with optical amplitudes, phases, and wavelengths and, therefore, descriptions provided herein refer to "optical" signals (or light) and "optical" components (e.g., "electro-optical device 116"). However, PIC die 104, as described herein, is not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the RF and/or microwave bands.

Turning back to FIG. 1A, PIC die 104 may comprise a plurality of waveguides 108 disposed in more than one layer 118 of dielectric material 120. In various embodiments, dielectric material 120 comprises silicon oxide, silicon nitride, silicon carbonitride, and other such inorganic materials commonly used to fabricate PIC dies such as PIC die 104. In some embodiments, dielectric material 120 may have a different refractive index than waveguide 108 to a range of wavelengths of the electromagnetic radiation transmitted or generated by optical structures 106 in PIC die 104.

In various embodiments, the operations of at least some optical structures 106 in PIC die 104 is controlled by an electrical controller circuit 122, for example, 122(1) and 122(2). Electrical controller circuit 122 may comprise serializer/deserializer (SERDES) circuits configured to transmit or receive electrical signals in a range of bandwidths, and driver circuits configured to control optical structures 106, for example, electromagnetic radiation sources 114, that transform the electrical signals into optical signals of in a desired range of wavelengths. In the example embodiment shown in the figure, electrical controller circuits 122 are provided in separate IC dies 124. For example, electrical controller circuit 122(1) is provided in IC die 124(1); electrical controller circuit 122(2) is provided in IC die 124(2). PIC die 104 may be coupled to IC dies 124 by interconnects 126. IC dies 124 may, in turn, be coupled to IC dies 102 by interconnects 128. In some embodiments, interconnects 126 and 128 may be of the same type (e.g., micro-bumps, hybrid interconnects, etc.); in other embodiments, interconnects 126 and 128 may be of a different type (e.g., interconnects 126 may be hybrid bonds and interconnects 128 may be micro-bumps). Interconnects 126 and/or 128 may comprise FLI as described in the previous subsection. In various embodiments, interconnects 126 and 128 may have pitches that are less than 10 micrometers between adjacent interconnects.

Figure 1C:
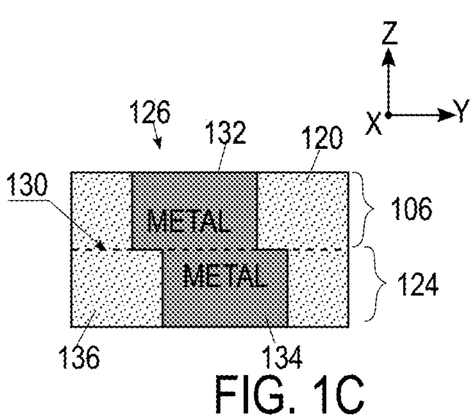
FIG. 1C is a schematic cross-sectional view of certain other details of example microelectronic assembly of FIG. 1A.

FIG. 1C is a schematic cross-sectional view of a detail of a particular one of interconnects 126 in microelectronic assembly 100. Note that although only interconnect 126 between PIC die 104 and IC die 124 is shown, the same structure and description may apply to any other such interconnects comprising hybrid bonds in microelectronic assembly 100, for example, interconnects 128 between IC dies 102 and 124. In a general sense, interconnect 126 may comprise, at an interface 130 between the coupled components, namely PIC die 104 and IC die 124 in the example shown, metal-metal bonds between bond-pads 132 of PIC die 104 and bond-pads 134 of IC die 124, and dielectric-dielectric bonds (e.g., oxide-oxide bonds) in dielectric materials 120 and 136 of PIC die 104 and IC die 124 respectively. Bond-pads 134 belonging to IC die 124 may bond with bond-pads 132 of PIC die 104. Dielectric material 136 (e.g., silicon oxide, silicon nitride, silicon oxynitride, etc.) in IC die 124 may bond with dielectric material 120 in PIC die 104. In some embodiments, dielectric material 136 of IC die 124 is the same as dielectric material 120 of PIC die 104. The bonded metal and dielectric materials form interconnect 126, comprising hybrid bonds, providing electrical and mechanical coupling between PIC die 104 and IC die 124. In various embodiments, interconnects 126 may have a linear dimension of less than 5 micrometers and a pitch of less than 10 micrometers between adjacent interconnects.

Turning back to FIG. 1A, an inorganic material 138 may fill any space between IC dies 124(1) and 124(2), for example, to provide mechanical stability, ease of handling, etc. In some embodiments, IC dies 124 may be part of a reconstituted wafer comprising known good dies assembled together with a gap fill material, such as silicon oxide or silicon nitride, between adjacent IC dies. In such embodiments, inorganic material 138 may comprise such gap fill material. IC dies 102 may be further assembled on a package substrate 140 by SLI 142. SLI 142 may comprise solder-based interconnections in some embodiments as described in the previous subsection.

Figure 1D:
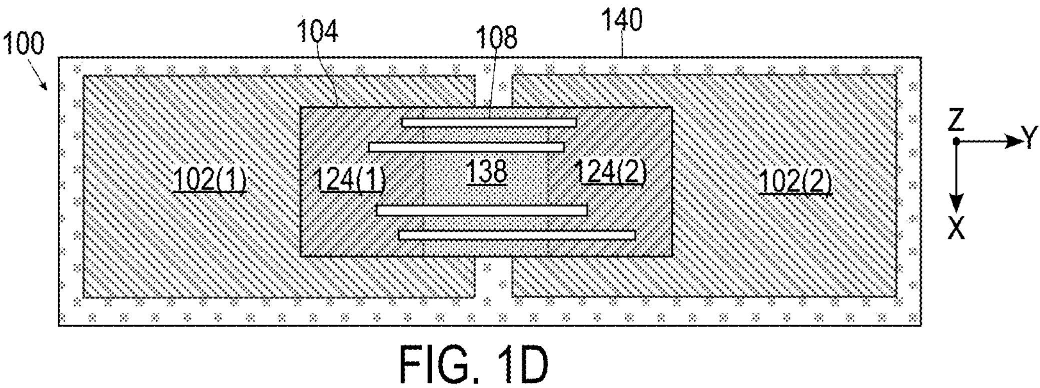
FIG. 1D is a schematic top view of example microelectronic assembly of FIG. 1A.

FIG. 1D is a schematic top view of microelectronic assembly 100. In some embodiments, signal interfaces between IC dies 102 and 124 are distributed in respective regions of overlap in IC die 102 and are not clustered proximate to respective shorelines of IC dies 102. In a general sense, the "shoreline" refers to the edge of an IC die, and signal interfaces for communication between IC dies are typically clustered near the respective shorelines. In contrast, in embodiments of microelectronic assembly 100, signal interfaces can be distributed in a larger region, allowing a greater number of interconnections between IC dies 102 and 124 for IC dies having comparable edge lengths. In some embodiments, PIC die 104 may completely overlap contacting surfaces of IC dies 124; in other embodiments, PIC die 104 may partially overlap contacting surfaces of IC dies 124. Various waveguides 108 of varying lengths may facilitate communication between IC dies 124 and thereby between circuits 110(1) and 110(2) (not labeled). In some embodiments, the configuration as described herein can enable communication speeds of between 3 Terabytes per second and 10 Terabytes per second between IC dies 102(1) and 102(2).

In various embodiments, IC dies 102 may be reticle sized, for example, measuring 33 millimeters along one edge and 26 millimeters along an orthogonal edge. IC dies 102(1) and 102(2) may be separated by a gap ranging approximately between 40 micrometers and 10 millimeters. PIC die 104 may be rectangular in some embodiments, having a long edge and an orthogonal short edge. The short edge may extend across the gap between IC dies 102, for example, over inorganic material 138. In many embodiments, PIC die 104 may have a total overlap over IC dies 124 of 10 millimeters; in other words, the short edge of PIC die 104 may be approximately 10 millimeters wider than the gap. In such embodiments, the long edge of PIC die 104 may be less than 33 millimeters or the width of IC dies 102, whichever is shorter. In some embodiments, the long edge of PIC die 104 may extend over the gap, the long edge may be approximately 10 millimeters wider than the gap. In such embodiments, the short edge may be less than 26 millimeters or the width of IC dies 102, whichever is shorter. In many embodiments, any IC die 102, 124 or PIC die 104 in microelectronic assembly 100 may not exceed 33 millimeters along the respective longest edge and 26 millimeters along an orthogonal edge, 33 mm×26 mm being the size of a reticle.

Figures 1E, 2:
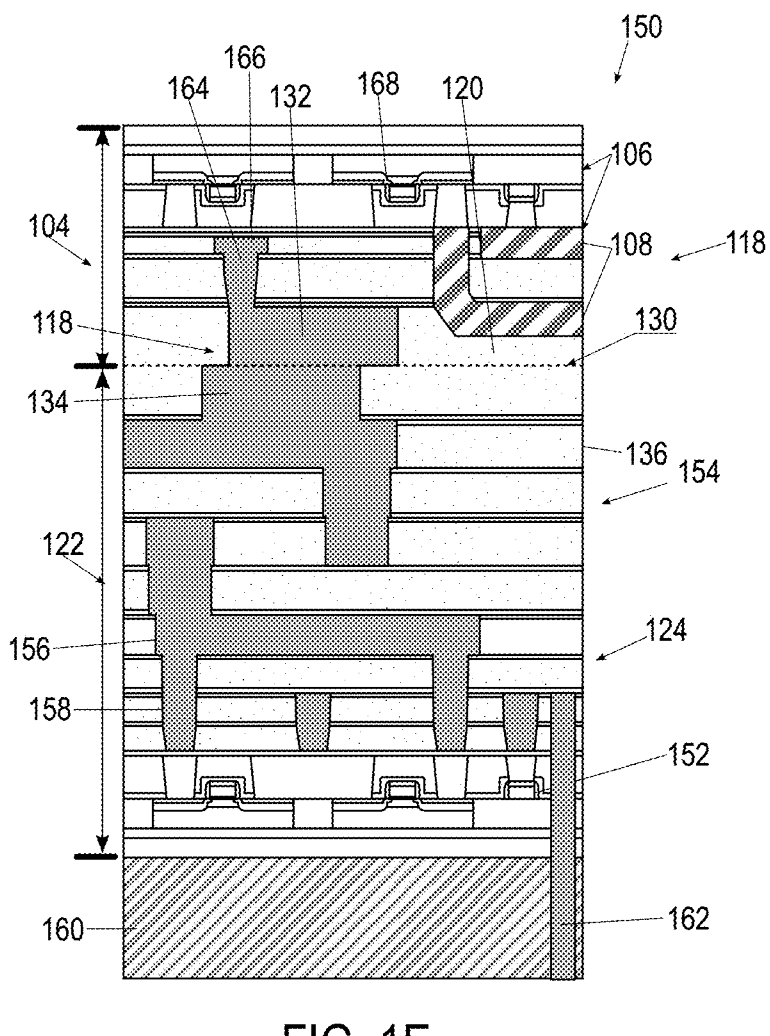
FIG. 1E is a schematic cross-sectional view of certain other details of example microelectronic assembly of FIG. 1A.
FIG. 2 is a schematic cross-sectional view of another example microelectronic assembly according to some embodiments of the present disclosure.

The operations of microelectronic assembly 100 may be understood in greater depth by studying the structure of electrical pathways and photonic pathways in microelectronic assembly 100 as shown in FIG. 1E. FIG. 1E illustrates a portion 150 of a cross-section of microelectronic assembly 100 in greater detail. Note that the figure is an incomplete two-dimensional representation of a complex three-dimensional structure, and only a few elements are shown for clarity and ease of illustration. Portion 150 comprises a part of electrical controller circuit 122 in IC die 124; electrical controller circuit 122 may include active components 152 such as transistors and diodes, and a metallization stack 154 comprising layers of dielectric material 136 (and other materials), conductive traces 156 in various layers of dielectric material 136 and conductive vias 158 through various layers of dielectric material 136. Note that conductive traces 156 may extend in and out of the plane of the page from the perspective shown in the figure. Active components 152 may be fabricated in a substrate 160 of semiconductor material or other suitable material as described in the previous subsection. Other materials or/and layers, not specifically shown in FIG. 1E may also be provided as may be known to those skilled in the art.

Electrical signals, such as power and/or input/output signals, may be routed to and/or from active components 152, other parts of IC die 124 (e.g., other circuits in IC die 124), circuits 110 in IC die 102, circuits in package substrate 140 or other components of microelectronic assembly 100 through one or more conductive traces 156 and conductive vias 158. In various embodiments, conductive traces 156 and conductive vias 158 may be arranged in one or more power grids, signal grids, and/or ground grids. In various embodiments, through substrate vias (TSVs) 162 may be disposed through substrate 160 into portions of metallization stack 154, providing conductive pathways from the backside of IC die 124. In some embodiments, TSVs 162 may extend all the way to interface 130 with PIC die 104; in other embodiments, TSVs 162 may terminate at an intermediate layer in metallization stack 154. TSVs 162 may be electrically coupled to other components in IC die 124, for example, to a power grid or a ground grid as appropriate. The other end of TSVs 162 at the backside of IC die 124 may be conductively coupled to interconnects 128 with IC die 102.

PIC die 104 may be coupled to IC die 124 by interconnects 126 comprising hybrid bonds, including metal-metal bonds between bond-pads 134 of IC die 124 and bond-pads 132 of PIC die 104 as described in reference to FIG. 1C. Conductive vias 164 and conductive traces 166 may conductively couple bond-pads 132 through one or more layers

118 of dielectric material 120 to active components 168 of PIC die 104. Optical structures 106 may be disposed in one or more layers 118. For example, waveguides 108 may be disposed in one or more layers 118. Optical structures 106 (e.g., electromagnetic radiation sources 114 and/or electro-optical devices 116) may be disposed in a substrate portion of PIC die 104 alongside other active components 168. In the embodiment shown in the figure, the substrate portion is insubstantial (e.g., ground down or otherwise removed except for active components 168); in other embodiments, the substrate portion may be thicker than shown in the figure.

During operation, electrical signals, for example, from circuit 110(1) in IC die 102(1) may be routed through TSV 162 to active components 152. Active components 152 may transform the electrical signals appropriately and forward them to bond-pad 134 through conductive traces 156 and conductive vias 158. The electrical signals may be further conducted to active components 168 in PIC die 104 through conductive vias 164 and conductive traces 166. Active components 168 may be conductively coupled with or may form part of certain optical structures 106. For example, active components 168 may comprise electronic transistors in electro-optical device 116. Optical structures 106 may transform the electrical signals to optical signals and transmit them through one or more waveguides 108 disposed in one or more layers 118 of PIC die 104. In the embodiment shown in the figure, the communicative pathway between circuits 110(1) and 110(2) comprises electrical pathways and photonic pathways, and may include (among other components) conductive traces and vias (not labeled) in IC dies 102, interconnects 128, TSVs 162, conductive traces 156 and conductive vias 158 in IC dies 124, interconnects 126, conductive vias 164, conductive traces 166 and waveguides 108 in PIC die 104.

FIG. 2 is a simplified cross-sectional view of microelectronic assembly 100 according to another embodiment. The embodiment shown in FIG. 2 differs from that shown in FIG. 1 in the absence of IC dies 124. In the embodiment of FIG. 2, electrical controller circuits 122 are disposed in IC dies 102 rather in separate IC die 124. For example, electrical controller circuit 122(1) is disposed in IC die 102(1) and electrical controller circuit 122(2) is disposed in IC die 102(2). PIC die 104 may be coupled to IC dies 102 by interconnects 126, comprising hybrid bonds as described in FIG. 18. Thus, the electrical pathways and photonic pathways as shown in FIG. 1E may be modified for the embodiment of FIG. 2 by replacing IC die 124 with IC die 102. Thus, in FIG. 1E, components labeled as belonging to IC dies 124 in the embodiment of FIG. 1A may belong to IC dies 102 in the embodiment of FIG. 2. Thus, the communicative pathway between circuits 110(1) and 110(2) comprises electrical pathways and photonic pathways, and may include (among other components) conductive traces 156 and conductive vias 158 in IC dies 102, interconnects 126, conductive vias 164, conductive traces 166 and waveguides 108 in PIC die 104.

Figures 3A, 3B:
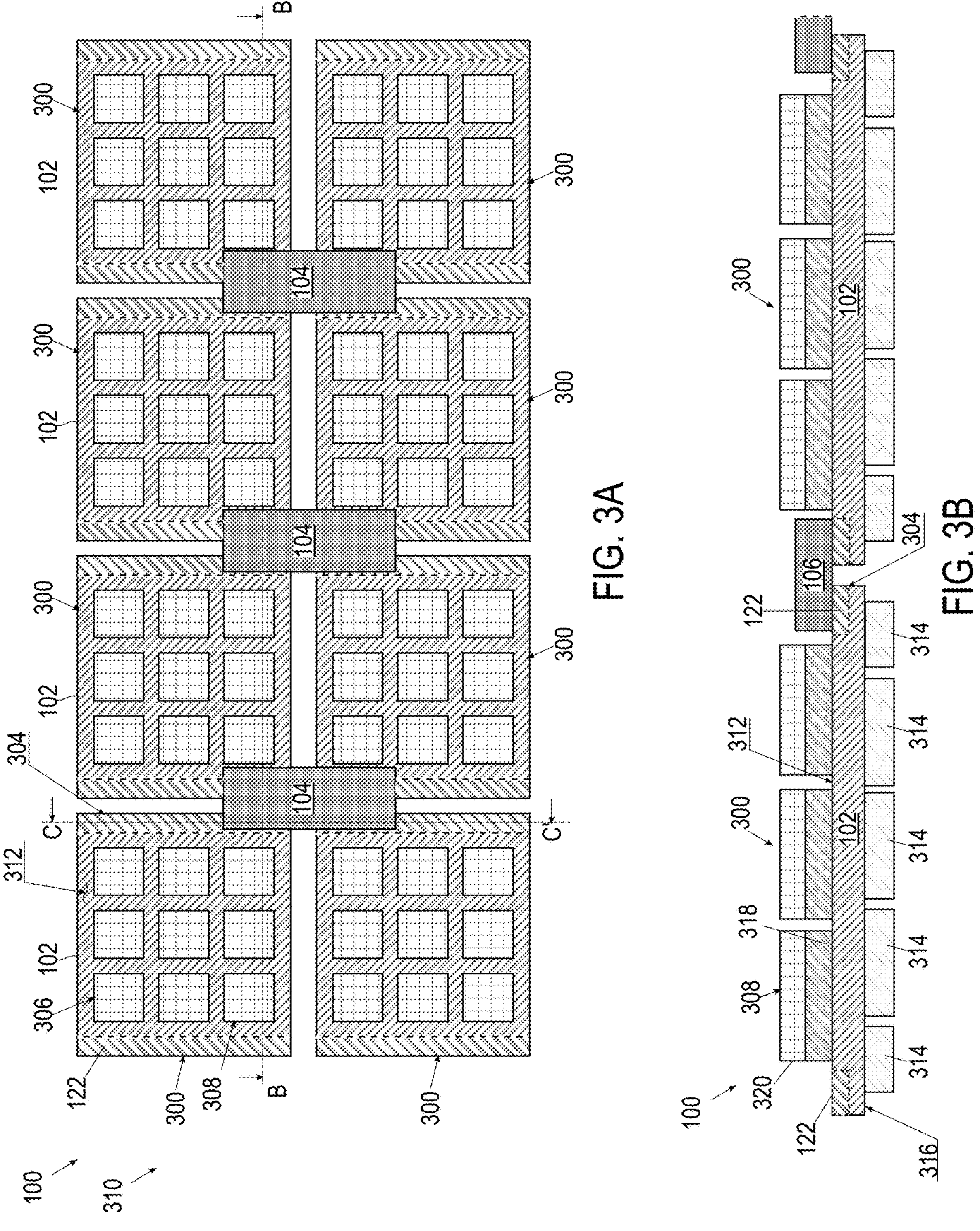
FIG. 3A is a schematic top view of a portion of an example microelectronic assembly according to some embodiments of the present disclosure.
FIG. 3B is a schematic cross-sectional view of a portion of the example microelectronic assembly of FIG. 3A.

FIG. 3A is a simplified top view of microelectronic assembly 100 according to another embodiment. Microelectronic assembly 100 comprises a plurality of microelectronic sub-assemblies 300 arranged in an array 302 with a gap between adjacent microelectronic sub-assemblies 300. The gap may range from 40 micrometers to 10 millimeters in various embodiments. In various embodiments, each microelectronic sub-assembly 300 occupies an area not more than 33 millimeters by 26 millimeters, which is the size of a reticle. Microelectronic assembly 100 further comprises a plurality of PIC dies 104 coupled to a subset of the plurality of microelectronic sub-assemblies 300. In some embodiments, adjacent ones of microelectronic sub-assemblies 300 are coupled to PIC die 104 by interconnects 126 (not shown) having a pitch of less than 10 micrometers between adjacent interconnects, as described in reference to FIGS. 1 and 2. Microelectronic sub-assemblies 300 thus coupled to each PIC die 104 are communicatively coupled by waveguides 108 in such PIC die 104. The configuration can enable communication speeds between microelectronic sub-assemblies 300 ranging from 3 Terabytes per second to 10 Terabytes per second.

In various embodiments, each microelectronic sub-assembly 300 comprises IC die 102, which may function as an interposer IC die. IC die 102 may comprise one or more electrical controller circuits 122 proximate to at least one edge 304 of IC die 102. A first plurality of IC dies 308 arranged in an array 310 may be coupled to a surface 312 of IC die. Further details of microelectronic assembly 100 may be described in reference to FIG. 2B, which is a simplified cross-section taken along axis BB' of a portion of microelectronic assembly 100.

As shown in FIG. 3B, microelectronic sub-assembly 300 further comprises a second plurality of IC dies 314 arranged on a surface 316 of IC die 102, surface 316 being opposite to surface 312. In some embodiments, plurality of IC dies 308 may comprise die stacks rather than individual IC dies. In an example embodiment, each die stack may include at least one memory IC die 318 having a cache memory circuit; and at least one compute IC die 320 having a compute circuit. Second plurality of IC dies 314 may comprise various circuits that may be advantageously used by the compute circuits of IC dies 320. Examples of IC dies 314 include a dynamic random access memory (DRAM) IC die having a DRAM circuit (e.g., tightly coupled cache DRAM (TCCD) circuit), a physical layer interface (PHY) IC die having a PHY circuit, and an input/output (IO) IC die having an IO circuit. In various embodiments, IC die 102 may comprise a network circuit configured with conductive pathways between first plurality of IC dies 308 and second plurality of IC dies 314.

Figure 3C:
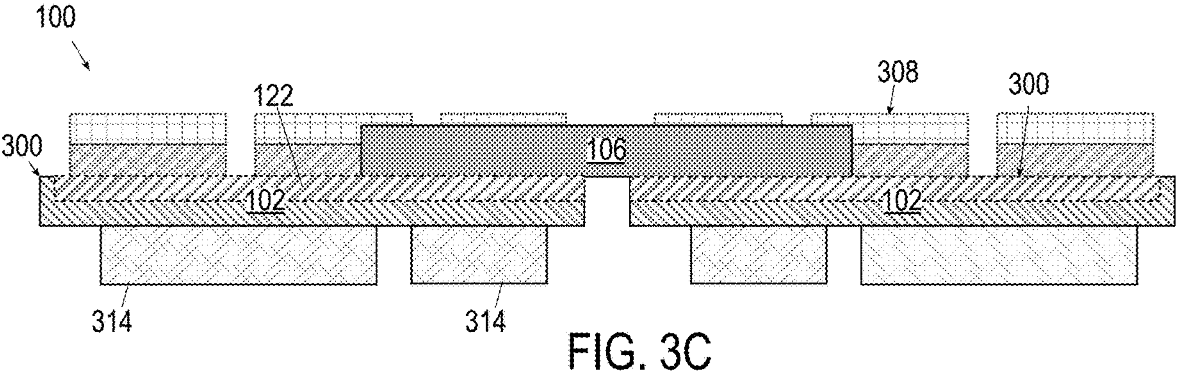
FIG. 3C is another schematic cross-sectional view of a portion of the example microelectronic assembly of FIG. 3A.

FIG. 3C shows another schematic cross-section of microelectronic assembly 100 of FIG. 3A, taken along axis CC'. As can be seen from the figure, electrical controller circuit 122 may extend along the length of edge 304 of IC die 102 in some embodiments (barring interference with other circuits along the edge, or the saw street of IC die 102). First plurality of IC dies 308 are shown in dotted lines to indicate that they are not in the plane of the cross-section, but "behind" the plane. In various embodiments, electrical controller circuit 122 in any one microelectronic sub-assembly 100 is configured to aggregate electrical signals from first plurality of IC dies 308 and second plurality of IC dies 314 and transmit the electrical signals to PIC die 104 to which electrical controller circuit 122 is coupled. As discussed in reference to FIGS. 1 and 2, PIC die 104 comprises optical structures 106 configured to transform the electrical signals into optical signals for communication between two or more of microelectronic sub-assemblies 300.

Figure 3D:
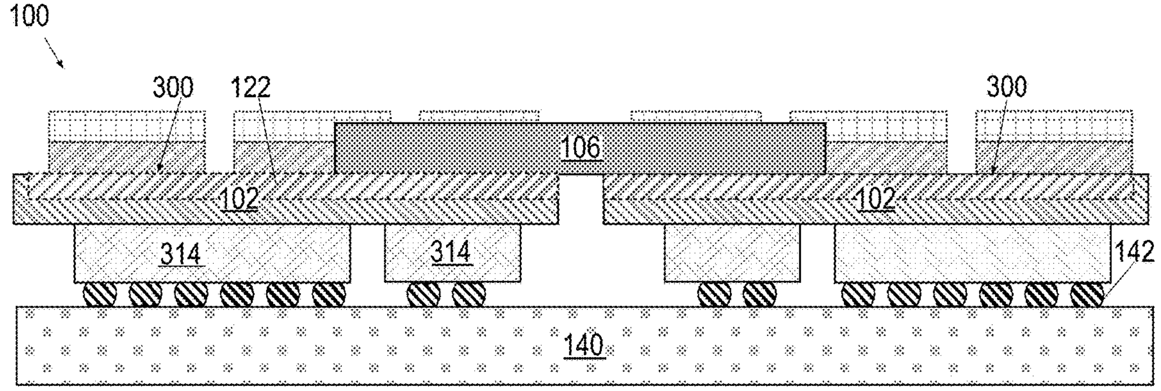
FIG. 3D is another schematic cross-sectional view of a portion of the example microelectronic assembly of FIG. 3A according to some other embodiments.

FIG. 3D is a simplified top view of microelectronic assembly 100 according to another embodiment, which includes package substrate 140 coupled to microelectronic sub-assemblies 300 by SLI 142. In embodiments in which second plurality of IC dies 314 are coupled to surface 316, package substrate 140 may be coupled to IC dies 314 by SLI 142. Power may be delivered to microelectronic sub-assembly 300 from package substrate 140. In some embodiments, power may be delivered to second plurality of IC dies 314 from package substrate 140; in other embodiments, power may be delivered to second plurality of IC dies 314 from IC die 102.

In various embodiments, any of the features discussed with reference to any of FIGS. 1-4 herein may be combined with any other features to form a package with one or more IC dies as described herein, for example, to form a modified microelectronic assembly 100. Some such combinations are described above, but, in various embodiments, further combinations and modifications are possible.

Example Methods

Figure 4:
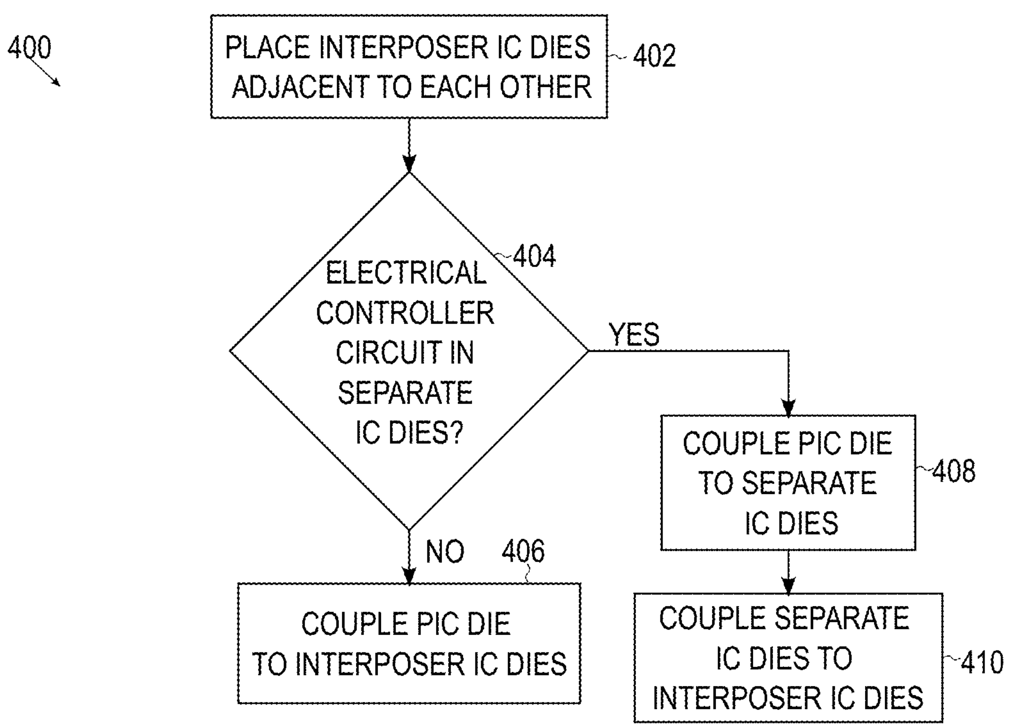
FIG. 4 is a simplified flow diagram illustrating example operations that may be associated with an example microelectronic assembly according to various embodiments.

FIG. 4 is a simplified flow diagram illustrating example operations 400 that may be associated with embodiments of microelectronic assembly 100. At 402, IC dies 102(1) and 102(2), referred to in the figure as "interposer IC die," suggestive of a functionality of IC die 102 as an interposer in an example embodiment, may be placed adjacent to each other. Note that IC dies 102 may have any other functionalities also without departing from the broad scope of the embodiments. At 404, a determination may be made whether electrical controller circuit 122 is provided in separate IC die 124, or in IC die 102. If electrical controller circuit 122 is provided in IC die 102, the operations may step to 406, at which PIC die 104 is coupled to IC dies 102 to obtain the example embodiment of microelectronic assembly 100 as described in FIG. 2. On the other hand, if at 404, the determination is made that electrical controller circuit 122 is provided in separate IC die 124, the operations may step to 408, at which PIC die 104 is coupled to IC dies 124. At 410, IC dies 124 may be coupled to IC dies 102 to obtain the example embodiment of microelectronic assembly 100 as described in FIG. 1.

Figure 5:
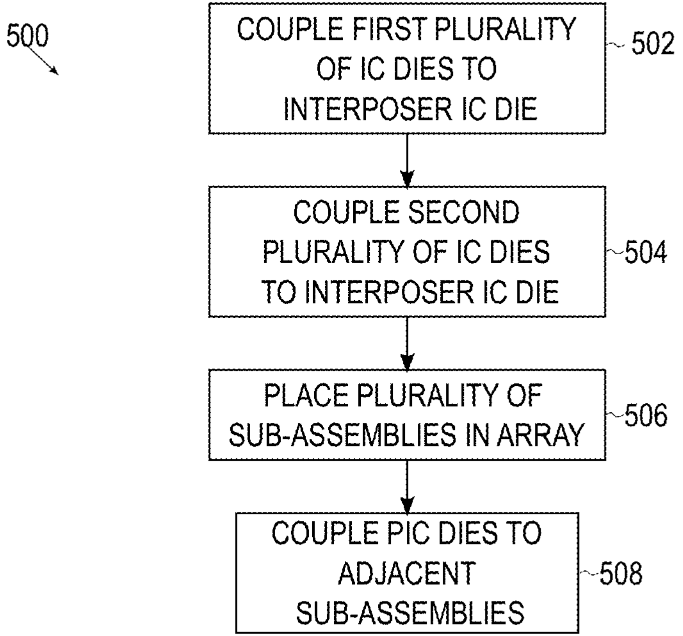
FIG. 5 is a simplified flow diagram illustrating other example operations that may be associated with another example microelectronic assembly according to various embodiments.

FIG. 5 is a simplified flow diagram illustrating example operations 500 that may be associated with embodiments of microelectronic assembly 100. At 502, first plurality of IC dies 308 may be coupled to IC die 102 on surface 312 of IC die 102. At 504, second plurality of IC dies 314 may be coupled to surface 316 of IC die 102 to complete forming microelectronic sub-assembly 300. At 506, a plurality of microelectronic sub-assemblies 300 may be placed (e.g., arranged) in an array comprising rows and columns. At 508, PIC dies 104 may be coupled to adjacent microelectronic sub-assemblies 300 to create microelectronic assembly 100 as described in FIG. 3.

Although FIGS. 4-5 illustrate various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIGS. 4-5 may be modified in accordance with the present disclosure to fabricate others of microelectronic assembly 100 disclosed herein. Although various operations are illustrated in FIGS. 4-5 once each, the operations may be repeated as often as desired. For example, one or more operations may be performed in parallel to manufacture multiple microelectronic packages substantially simultaneously. In another example, the operations may be performed in a different order to reflect the structure of a particular microelectronic package in which one or more substrates or other components as described herein may be included.

Furthermore, the operations illustrated in FIGS. 4-5 may be combined or may include more details than described. Still further, the various operations shown and described may further include other manufacturing operations related to fabrication of other components of the microelectronic assemblies described herein, or any devices that may include the microelectronic assemblies as described herein. For example, the operations not shown in FIGS. 4-5 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 6:
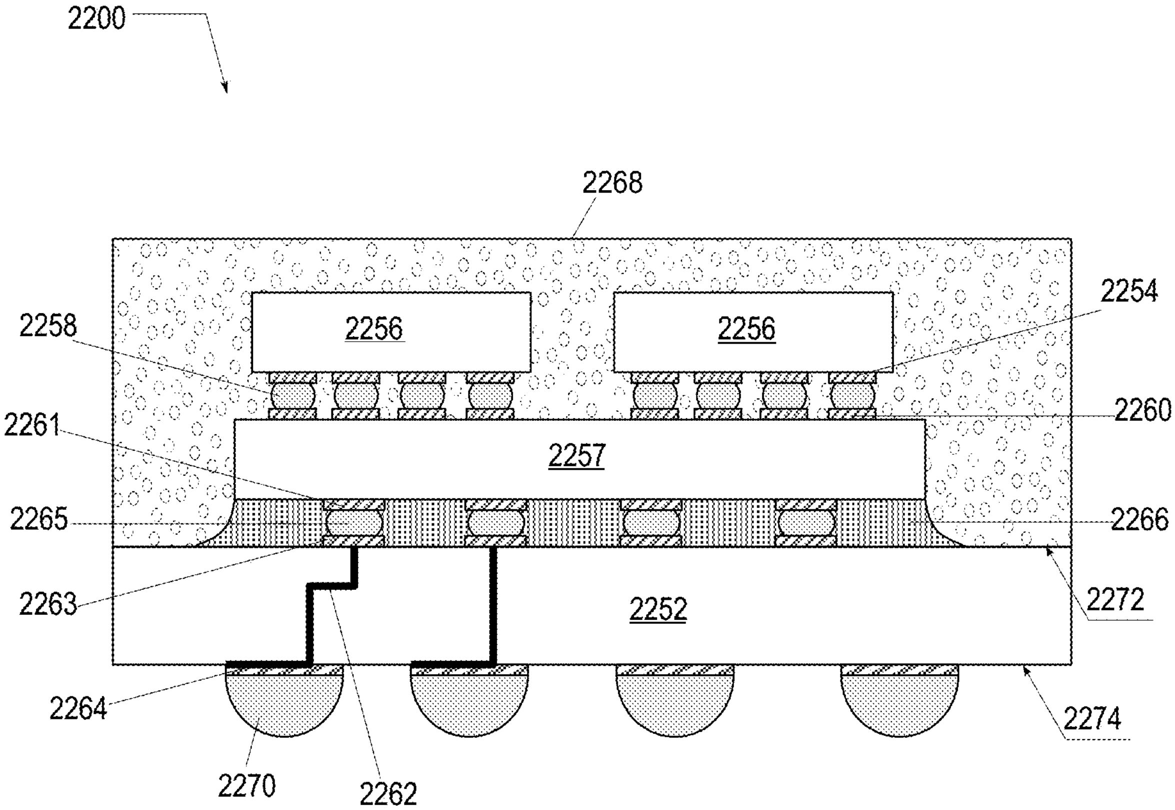
FIG. 6 is a cross-sectional view of a device package that includes one or more microelectronic assemblies in accordance with any of the embodiments disclosed herein.
Figure 7:
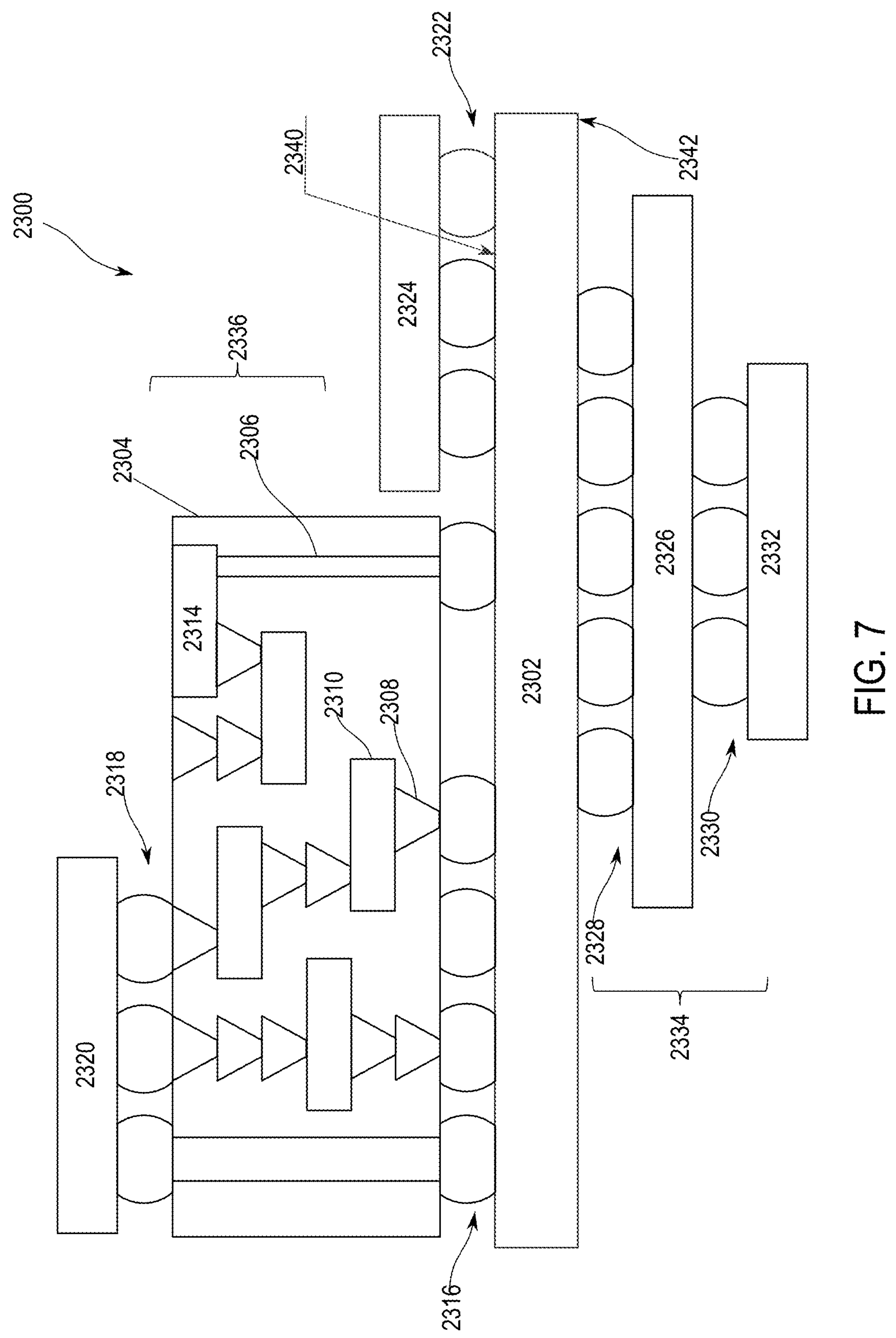
FIG. 7 is a cross-sectional side view of a device assembly that includes one or more microelectronic assemblies in accordance with any of the embodiments disclosed herein.
Figure 8:
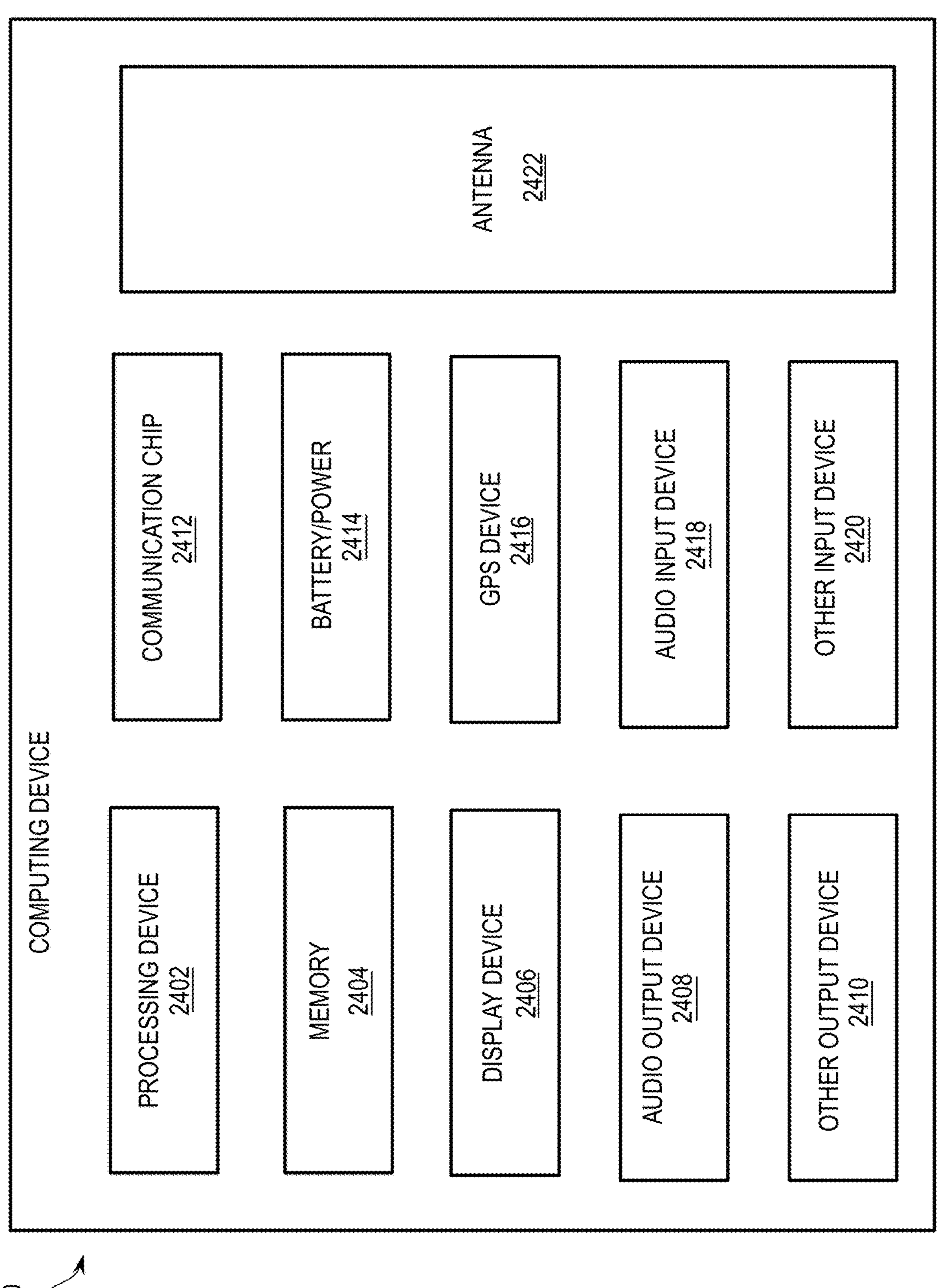
FIG. 8 is a block diagram of an example computing device that includes one or more microelectronic assemblies in accordance with any of the embodiments disclosed herein.

The packages disclosed herein, e.g., any of the embodiments shown in FIGS. 1-5 or any further embodiments described herein, may be included in any suitable electronic component. FIGS. 6-8 illustrate various examples of packages, assemblies, and devices that may be used with or include any of the IC packages as disclosed herein.

FIG. 6 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 7.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 7 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 6.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 6. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 8 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 6). In yet another example, any one or more of the components of computing device 2400 may include an IC device assembly 2300 (e.g., as shown in FIG. 7).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded DRAM (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly (e.g., 100, FIG. 1A, FIG. 2A), comprising: a first IC die (e.g., 102(1)); a second IC die (e.g., 102(2)); and a PIC die (e.g., 104) conductively coupled to the first IC die and the second IC die, in which: the first IC die and the second IC die are coplanar, adjacent, and separated by a gap, the PIC die comprises optical structures (e.g., 106), the optical structures include at least one waveguide (e.g., 108), and electrical circuits (e.g., 110(1)) in the first IC die are communicatively coupled to electrical circuits (e.g., 110(2)) in the second IC die by at least one photonic pathway (e.g., 112) through the waveguide.

Example 2 provides the microelectronic assembly of example 1, in which the optical structures further include at least one of electromagnetic radiation sources (e.g., 114) or electro-optical devices (e.g., 116).

Example 3 provides the microelectronic assembly of any one of examples 1-2, in which the optical structures further include a plurality of waveguides in more than one layer (e.g., 118) of a dielectric material (e.g., 120) in the PIC die.

Example 4 provides the microelectronic assembly of any one of examples 1-3, in which (e.g., FIG. 2A): the PIC die is conductively coupled to a first electrical controller circuit (e.g., 122(1)) and a second electrical controller circuit (e.g., 122(2)), and the first electrical controller circuit and the second electrical controller circuit are configured to control operations of at least some optical structures in the PIC die.

Example 5 provides the microelectronic assembly of example 4, in which the first electrical controller circuit and the second electrical controller circuit comprise: SERDES circuits configured to transmit or receive electrical signals in a first range of bandwidths; and driver circuits configured to control at least some optical structures that transform the electrical signals into optical signals in a different second range of bandwidths.

Example 6 provides the microelectronic assembly of any one of examples 4-5, further comprising (e.g., FIG. 1A): a third IC die (e.g., 124(1)) having the first electrical controller circuit; and a fourth IC die (e.g., 124(2)) having the second electrical controller circuit, in which: the PIC die is coupled to the third IC die and the fourth IC die by first interconnects (e.g., 126), and the third IC die and the fourth IC die are coupled respectively to the first IC die and the second IC die by second interconnects (e.g., 128).

Example 7 provides the microelectronic assembly of example 6, in which the first interconnects and the second interconnects have pitches that are less than 10 micrometers between adjacent interconnects.

Example 8 provides the microelectronic assembly of any one of examples 6-7, in which (e.g., FIG. 1B): a first subset of the first interconnects is between the PIC die and the third IC die, interconnects in the first subset include metal-metal bonds between metal pads (e.g., 132, 134) in the PIC die and the third IC die, and dielectric-dielectric bonds between dielectric materials (e.g., 120, 136) in the PIC die and the third IC die, and a second subset of the first interconnects is between the PIC die and the fourth IC die, interconnects in the second subset include metal-metal bonds between metal pads in the PIC die and the fourth IC die, and dielectric-dielectric bonds between dielectric materials in the PIC die and the fourth IC die.

Example 9 provides the microelectronic assembly of any one of examples 6-8, in which signal interfaces between the first IC die and the third IC die and between the second IC die and the fourth IC die are distributed in respective regions of overlap in the first IC die and the second IC die and are not clustered proximate to respective shorelines of the first IC die and the second IC die.

Example 10 provides the microelectronic assembly of any one of examples 6-9, further comprising an inorganic material (e.g., 138) between the third IC die and the fourth IC die, in which the inorganic material comprises a compound including silicon and at least one of nitrogen and oxygen.

Example 11 provides the microelectronic assembly of any one of examples 1-10, in which the first IC die and the second IC die are coupled to a package substrate (e.g., 140) by interconnects (e.g., 142) having a pitch greater than 10 micrometers between adjacent interconnects.

Example 12 provides the microelectronic assembly of any one of examples 4-11, in which (e.g., FIG. 1E): the first electrical controller circuit comprises a plurality of layers of the dielectric material, conductive traces in more than one layer of the dielectric material, and conductive vias coupled to the conductive traces through one or more layers of the dielectric material, at least some conductive vias of the first electrical controller circuit are coupled to the metal pads in the first IC die that are bonded to the metal pads in the PIC die, the PIC die comprises another plurality of layers of the dielectric material, conductive traces in more than one layer of the dielectric material, conductive vias coupled to the conductive traces through one or more layers of the dielectric material, and the waveguide in one or more layers of the dielectric material, and at least some conductive vias in the PIC die are coupled to the metal pads in the PIC die that are bonded to the metal pads in the first IC die.

Example 13 provides the microelectronic assembly of example 4, in which (e.g., FIG. 2A): the first electrical controller circuit is in the first IC die and the second electrical controller circuit is in the second IC die, and the PIC die is coupled to the first IC die and the second IC die by interconnects having a pitch of less than 10 micrometers between adjacent interconnects.

Example 14 provides the microelectronic assembly of example 13, in which: a first subset of the interconnects is between the PIC die and the first IC die, interconnects in the first subset include metal-metal bonds between metal pads in the PIC die and the first IC die, and dielectric-dielectric bonds between dielectric material in the PIC die and the first IC die, and a second subset of the interconnects is between the PIC die and the second IC die, interconnects in the second subset include metal-metal bonds between metal pads in the PIC die and the second IC die, and dielectric-dielectric bonds between dielectric materials in the PIC die and the second IC die.

Example 15 provides the microelectronic assembly of any one of examples 1-14, in which the electrical circuits in the first IC die and the second IC die comprise 10 interface circuits.

Example 16 provides the microelectronic assembly of any one of examples 1-15, in which: the PIC die has a long edge and an orthogonal short edge, the short edge extends across the gap, the short edge is approximately 10 millimeters wider than the gap, and the long edge is not more than 33 millimeters in length.

Example 17 provides the microelectronic assembly of any one of examples 1-15, in which: the PIC die has a long edge and an orthogonal short edge, the long edge extends across the gap, the long edge is approximately 10 millimeters wider than the gap, and the short edge is not more than 26 millimeters in length.

Example 18 provides the microelectronic assembly of any one of examples 1-17, in which: the gap is approximately in a range between 5 millimeters and 10 millimeters.

Example 19 provides the microelectronic assembly of any one of examples 1-18, in which the first IC die and the second IC die are each approximately 33 millimeters in length measured along a first axis (e.g., Y-axis), and 26 millimeters in length measured along an orthogonal second axis (e.g., X-axis).

Example 20 provides the microelectronic assembly of any one of examples 1-20, in which the waveguide is configured to transmit signals at a speed in a range between 3 Terabytes/second and 10 Terabytes/second.

Example 21 provides a PIC die, comprising: a first subset of optical structures (e.g., 106); a second subset of optical structures in a dielectric material (e.g., 120); metal pads (e.g., 132) at a surface of the PIC die; conductive traces (e.g., 166) coupled between the metal pads and the optical structures, in which: the optical structures comprise at least one each of: an electromagnetic radiation source (e.g., 114), an electro-optical device (e.g., 116), and a waveguide (e.g., 108), the metal pads are arranged with a pitch of less than 10 micrometers between adjacent ones of the metal pads, and the PIC die is configured to be coupled to two IC dies (e.g., 102, 124) that are coplanar, adjacent and spaced apart from each other by a gap.

Example 22 provides the PIC die of example 21, in which the waveguide is configured to provide a photonic pathway (e.g., 112) for communication between the two IC dies.

Example 23 provides the PIC die of any one of examples 21-22, in which electrical controller circuits (e.g., 122) are configured to control operations of the optical structures.

Example 24 provides the PIC die of example 23, in which the electrical controller circuits are provided in separate IC dies (e.g., 124) coupled to the two IC dies (e.g., 102).

Example 25 provides the PIC die of example 24, in which the PIC die is coupled to the two separate IC dies by hybrid interconnects (e.g., 126) comprising metal-metal bonds and dielectric-dielectric bonds.

Example 26 provides the PIC die of example 23, in which the electrical controller circuits are provided in the two IC dies.

Example 27 provides the PIC die of example 26, in which the PIC die is coupled to the two IC dies by hybrid interconnects (e.g., 126) comprising metal-metal bonds and dielectric-dielectric bonds.

Example 28 provides the PIC die of example 27, in which the hybrid interconnects have a pitch of less than 10 micrometers between adjacent ones of the interconnects.

Example 29 provides the PIC die of any one of examples 21-28, in which the PIC die is not longer than approximately 33 millimeters along any one edge.

Example 30 provides the PIC die of any one of examples 21-29, in which the two IC dies are approximately 33 millimeters by 26 millimeters.

Example 31 provides the PIC die of any one of examples 21-30, in which the PIC die is configured to support communication between the two IC dies at speeds between 3 Terabytes per second and 10 Terabytes per second.

Example 32 provides a method, comprising: placing a first IC die (e.g., 102(1)) and a second IC die (e.g., 102(2)) adjacent to each other such that the first IC die and the second IC die are coplanar and separated by a gap; communicatively coupling a PIC die (e.g., 104) to the first IC die and the second IC die such that a communication pathway between the first IC die and the second IC die is through a photonic pathway in a waveguide of the PIC die.

Example 33 provides the method of example 32, further comprising: coupling a third IC die to the first IC die and the PIC die such that the third IC die is between the first IC die and the PIC die; and coupling a fourth IC die to the second IC die and the PIC die such that the fourth IC die is between the second IC die and the PIC die, in which the coupling comprises forming metal-metal bonds and dielectric-dielectric bonds at the respective coupled interfaces between the first IC die, the third IC die, the second IC die, the fourth IC die and the PIC die.

Example 34 provides the method of any one of examples 32-33, in which the PIC die comprises a plurality of waveguides in different layers of a dielectric material.

Example 35 provides the method of example 34, in which the dielectric material has a different refractive index than the waveguides to a range of bandwidths of electromagnetic signals generated or transmitted by the PIC die.

Example 36 provides the method of any one of examples 32-35, further comprising coupling the first IC die and the second IC die to a package substrate with second-level interconnects.

Example 37 provides a microelectronic assembly (e.g., 100, FIG. 3A), comprising: a plurality of microelectronic sub-assemblies (e.g., 300) arranged in an array (e.g., 302); and a plurality of PIC dies (e.g., 104), each PIC die having waveguides (e.g., 108), in which: adjacent ones of the microelectronic sub-assemblies are coupled to one of the PIC dies by interconnects having a pitch of less than 10 micrometers between adjacent interconnects such that any one PIC die is coupled to more than two adjacent microelectronic sub-assemblies, and the microelectronic sub-assemblies coupled to each PIC die in the plurality of PIC dies are communicatively coupled by the waveguides in the PIC die.

Example 38 provides the microelectronic assembly of example 37, in which each microelectronic sub-assembly comprises: an interposer IC die (e.g., 102) comprising one or more electrical controller circuit (e.g., 122) proximate to at least one edge (e.g., 304) of the interposer IC die; a first plurality of IC dies (e.g., 308) coupled to a first surface (e.g., 312) of the interposer IC die; and a second plurality of IC dies (e.g., 314) coupled to a second surface (e.g., 316) of the interposer IC die, the second surface being opposite the first surface.

Example 39 provides the microelectronic assembly of example 38, in which: the first plurality of IC dies comprises die stacks, and each die stack includes: at least one memory IC die (e.g., 318) having a cache memory circuit; and at least one compute IC die (e.g., 320) having a compute circuit.

Example 40 provides the microelectronic assembly of any one of examples 38-39, in which the first plurality of IC dies is arranged in an array (e.g., 310).

Example 41 provides the microelectronic assembly of any one of examples 38-40, in which the second plurality of IC dies comprises at least one of: a DRAM IC die having a DRAM circuit, a physical layer interface (PHY) IC die having a PHY circuit, and an IO IC die having an IO circuit.

Example 42 provides the microelectronic assembly of any one of examples 38-41, in which the interposer IC die further comprises a network circuit configured with conductive pathways between the first plurality of IC dies and the second plurality of IC dies.

Example 43 provides the microelectronic assembly of any one of examples 38-42, in which the electrical controller circuit extends along a length of the at least one edge of the interposer IC die.

Example 44 provides the microelectronic assembly of any one of examples 38-44, in which the at least one edge of adjacent interposer IC dies are adjacent to each other.

Example 45 provides the microelectronic assembly of any one of examples 38-44, in which: the electrical controller circuit in the interposer IC die is conductively coupled to the one of the PIC dies by the interconnects, the electrical controller circuit is configured to aggregate electrical signals from the first plurality of IC dies and the second plurality of IC dies and transmit the electrical signals to the one of the PIC dies, and the one of the PIC dies comprises optical structures configured to transform the electrical signals into optical signals for communication to one or more of other microelectronic sub-assemblies coupled to the one of the PIC dies.

Example 46 provides the microelectronic assembly of any one of examples 37-45, in which: a gap is present between adjacent microelectronic sub-assemblies, and the gap is approximately between 40 micrometers and 10 millimeters.

Example 47 provides the microelectronic assembly of any one of examples 37-46, in which each microelectronic sub-assembly occupies an area not more than 33 millimeters by 26 millimeters.

Example 48 provides the microelectronic assembly of any one of examples 37-47, in which each PIC die comprises waveguides in more than one layer.

Example 49 provides the microelectronic assembly of any one of examples 37-48, in which the plurality of microelectronic sub-assemblies is coupled to a package substrate (e.g., 140) by second-level interconnects (e.g., 142).

Example 50 provides the microelectronic assembly of any one of examples 37-49, in which each PIC die is coupled to four adjacent microelectronic sub-assemblies.

Example 51 provides the microelectronic assembly of any one of examples 37-50, in which the PIC dies are configured to enable communication between the microelectronic sub-assemblies with speed ranging from 3 Terabytes per second to 10 Terabytes per second.

Example 52 provides a PIC die, comprising: a first subset of optical structures (e.g., 106); a second subset of optical structures in a dielectric material (e.g., 120); metal pads (e.g., 132) at a surface of the PIC die; and conductive traces (e.g., 166) coupled between the metal pads and the optical structures, in which: the optical structures comprise at least one each of: an electromagnetic radiation source (e.g., 114), an electro-optical device (e.g., 116), and a waveguide (e.g., 108), the metal pads are arranged with a pitch of less than 10 micrometers between adjacent ones of the metal pads, and the PIC die is configured to be coupled to four microelectronic assemblies (e.g., 300) that are coplanar, adjacent and spaced apart from each other by a gap.

Example 53 provides the PIC die of example 52, in which each microelectronic assembly comprises: an interposer IC die (e.g., 102) including an electrical controller circuit proximate to an edge (e.g., 304) of the interposer IC die, the electrical controller circuit being coupled to the PIC die by interconnects having a pitch of less than 10 micrometers between adjacent interconnects; a first plurality of IC dies (e.g., 308) arranged on a first surface (e.g., 312) of the interposer IC die; and a second plurality of IC dies (e.g., 314) arranged on a second surface (e.g., 316) of the interposer IC die, the second surface being opposite the first surface.

Example 54 provides the PIC die of example 53, in which electrical controller circuits are configured to control operations of the optical structures in the PIC die.

Example 55 provides the PIC die of any one of examples 53-54, in which the PIC die is coupled to the interposer IC die on the first surface.

Example 56 provides the PIC die of example 55, in which: the first plurality of IC dies comprises stacks of IC dies arranged in an array on the first surface, and a thickness of the PIC die is less than another thickness of the stacks of IC dies.

Example 57 provides the PIC die of any one of examples 53-56, in which the interconnects comprise metal-metal bonds between the metal pads of the PIC die and corresponding metal pads of the interposer IC die.

Example 58 provides the PIC die of any one of examples 55-57, in which the first plurality of IC dies and the second plurality of IC dies are coupled to the interposer IC die by ELI.

Example 59 provides the PIC die of any one of example 52-58, further comprising a plurality of waveguides in more than one layer of a dielectric material.

Example 60 provides the PIC die of any one of examples 52-59, in which the PIC die is configured to enable communication between the four microelectronic assemblies by one or more photonic pathways through the waveguide in the PIC die.

Example 61 provides the PIC die of any one of examples 52-60, in which the waveguide is in at least one of: silicon or a compound comprising silicon and at least one of oxygen and nitrogen.

Example 62 provides a method, comprising: placing a plurality of microelectronic assemblies adjacent to each other such that the microelectronic assemblies are coplanar and do not touch each other; and coupling a PIC die to the plurality of microelectronic assemblies such that the PIC die is proximate to adjacent corners of the microelectronic assemblies with one or more communication pathways between the microelectronic assemblies being through photonic pathways in waveguides of the PIC die.

Example 63 provides the method of example 62, in which the PIC die comprises a plurality of waveguides in different layers of a dielectric material.

Example 64 provides the method of example 63, in which the dielectric material has a different refractive index than the waveguides to a range of bandwidth of electromagnetic signals generated or transmitted by the PIC die.

Example 65 provides the method of any one of examples 62-64, further comprising coupling the microelectronic assemblies to a package substrate with second-level interconnects.

Example 66 provides the method of any one of examples 62-65, in which coupling the PIC die to the plurality of microelectronic assemblies comprises forming hybrid bonds comprising metal-metal bonds and dielectric-dielectric bonds between the PIC die and the plurality of microelectronic assemblies.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
an array of microelectronic sub-assemblies; and
a photonic integrated circuit (PIC) dies coupled to two or more microelectronic sub-assemblies of the array,
wherein an individual microelectronic sub-assembly of the array includes:
an interposer,
a first integrated circuit (IC) die coupled to a first side of the interposer,
a second IC die coupled to a second side of the interposer,
one of the first side and the second side is a top side and another one of the first side and the second side is a bottom side, and
the bottom side faces away from the top side.

2. The microelectronic assembly of claim 1, wherein:
the interposer includes one or more electrical controller circuits proximate to at least one edge of the interposer.

3. The microelectronic assembly of claim 1, wherein:
the individual microelectronic sub-assembly further includes a third IC die in a stack of IC dies coupled to the first side of the interposer,
the stack of IC dies further includes the first IC die,
one of the first IC die and the second IC die includes a cache memory circuit, and
another one of the first IC die and the second IC die includes a compute circuit.

4. The microelectronic assembly of claim 1, wherein the second IC die includes at least one of: a dynamic random access memory (DRAM) circuit, a physical layer interface (PHY) circuit, or an input/output (IO) circuit.

5. The microelectronic assembly of claim 1, wherein the interposer includes conductive pathways between the first IC die and the second IC die.

6. The microelectronic assembly of claim 1, wherein:
the interposer includes an electrical controller circuit conductively coupled to thePIC die, and
the electrical controller circuit is to aggregate electrical signals from the first IC die and the second IC die and transmit the electrical signals to the PIC die.

7. The microelectronic assembly of claim 1, wherein:
a gap is present between adjacent microelectronic sub-assemblies of the array, and the gap is approximately between 40 micrometers and 10 millimeters.

8. The microelectronic assembly of claim 1, wherein the PIC die comprises waveguides in more than one layer.

9. A process of fabricating a microelectronic assembly, the process comprising:
placing a plurality of microelectronic sub-assemblies adjacent to each other such that the microelectronic sub-assemblies are coplanar and do not touch each other; and
coupling a photonic integrated circuit (PIC) die with two or more of the microelectronic sub-assemblies,
wherein an individual microelectronic sub-assembly of the microelectronic sub-assemblies includes:
an interposer,
a first plurality of integrated circuit (IC) dies coupled to a first surface of the interposer, and
a second plurality of IC dies coupled to a second surface of the interposer, the second surface being opposite the first surface.

10. The process of claim 9, wherein the PIC die comprises a plurality of waveguides in different layers of a dielectric material.

11. The process of claim 10, wherein the dielectric material has a different refractive index than the waveguides to a range of bandwidth of electromagnetic signals to be generated or transmitted by the PIC die.

12. The process of claim 9, further comprising coupling the microelectronic sub-assemblies with a package substrate by second-level interconnects.

13. The process of claim 9, wherein coupling the PIC die with two or more of the microelectronic sub-assemblies comprises forming hybrid bonds comprising metal-metal bonds and dielectric-dielectric bonds between the PIC die and the two or more of the microelectronic sub-assemblies.

14. A microelectronic assembly, comprising:
microelectronic sub-assemblies arranged in an array; and
a photonic integrated circuit (PIC) die coupled to two or more of the microelectronic sub-assemblies, wherein an individual microelectronic sub-assembly of the microelectronic sub-assemblies includes:
an interposer,
a first plurality of integrated circuit (IC) dies coupled to a first surface of the interposer, and
a second plurality of IC dies coupled to a second surface of the interposer, the second surface being opposite the first surface.

15. The microelectronic assembly of claim 14, wherein the interposer includes an electrical controller circuit proximate to an edge of the interposer.

16. The microelectronic assembly of claim 15, wherein the edge of the interposer is an edge that is closest to the PIC die.

17. The microelectronic assembly of claim 16, wherein:
the electrical controller circuit is a first electrical controller circuit,
the edge of the interposer is a first edge of the interposer, and
the interposer further includes a second electrical controller circuit proximate to a second edge of the interposer.

18. The microelectronic assembly of claim 17, wherein the second edge of the interposer is opposite the first edge of the interposer.

19. The microelectronic assembly of claim 14, wherein the microelectronic assemblies are coplanar and wherein adjacent microelectronic assemblies are spaced apart from each other by a gap.

20. The microelectronic assembly of claim 14, wherein the PIC die is coupled to the two or more of the microelectronic sub-assemblies by interconnects having a pitch of less than 10 micrometers between adjacent interconnects.

* * * * *